(12) United States Patent
Sofer et al.

(10) Patent No.: US 11,940,390 B2
(45) Date of Patent: *Mar. 26, 2024

(54) SELECTING A REPRESENTATIVE SUBSET OF POTENTIAL DEFECTS TO IMPROVE DEFECT CLASSIFIER TRAINING AND ESTIMATION OF EXPECTED DEFECTS OF INTEREST

(71) Applicant: Applied Materials Israel Ltd., Rehovot (IL)

(72) Inventors: Yotam Sofer, Givatayim (IL); Shaul Engler, Hod-Hasharon (IL); Boaz Cohen, Lehavim (IL); Saar Shabtay, Moshav Mishmeret (IL); Amir Bar, Rehovot (IL); Marcelo Gabriel Bacher, Givatayim (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 17/829,593

(22) Filed: Jun. 1, 2022

(65) Prior Publication Data
US 2022/0291138 A1   Sep. 15, 2022

Related U.S. Application Data

(63) Continuation of application No. 16/782,005, filed on Feb. 4, 2020, now Pat. No. 11,360,030.

(51) Int. Cl.
*G01N 21/88* (2006.01)
*G06F 18/00* (2023.01)
(Continued)

(52) U.S. Cl.
CPC ......... *G01N 21/8851* (2013.01); *G06F 18/00* (2023.01); *G06F 30/27* (2020.01);
(Continued)

(58) Field of Classification Search
CPC ........ G01N 21/8851; G01N 2021/8854; G06F 30/27; G06V 10/70; G06V 10/993
See application file for complete search history.

(56) References Cited

U.S. PATENT DOCUMENTS

| 6,360,005 B1 | 3/2002 | Aloni et al. |
| 7,844,100 B2 | 11/2010 | Auerbach |

(Continued)

FOREIGN PATENT DOCUMENTS

| CN | 107004123 A | 8/2017 |
| CN | 107820620 A | 3/2018 |

(Continued)

OTHER PUBLICATIONS

J. Kim, S. Kim, N. Kwon, H. Kang, Y. Kim and C. Lee, "Deep learning based automatic defect classification in through-silicon Via process: FA: Factory automation," 2018 29th Annual SEMI Advanced Semiconductor Manufacturing Conference (ASMC), 2018, pp. 35-39, doi: 10.1109/ASMC.2018.8373144. (Year: 2018).

*Primary Examiner* — Michael Robert Cammarata
(74) *Attorney, Agent, or Firm* — Lowenstein Sandler LLP

(57) ABSTRACT

A system, method and computer readable medium for examining a specimen, the method comprising: obtaining defects of interest (DOIs) and false alarms (FAs) from a review subset selected from a group of potential defects received from an inspection tool, each potential defect is associated with attribute values defining a location of the potential defect in an attribute space; generating a representative subset of the group, comprising potential defects selected in accordance with a distribution of the potential defects within the attribute space, and indicating the potential defects in the representative subset as FA; and training a classifier using data informative of the attribute values of the DOIs, the potential defects of the representative subset, and respective indications thereof as DOIs or FAs, wherein the trained (Continued)

classifier is to be applied to at least some of the potential defects to obtain an estimation of a number of expected DOIs.

20 Claims, 5 Drawing Sheets

(51) Int. Cl.
*G06F 30/27* (2020.01)
*G06V 10/70* (2022.01)
*G06V 10/98* (2022.01)
*G06V 20/69* (2022.01)

(52) U.S. Cl.
CPC ............ *G06V 10/70* (2022.01); *G06V 10/993* (2022.01); *G06V 20/69* (2022.01); *G01N 2021/8854* (2013.01)

(56) References Cited

U.S. PATENT DOCUMENTS

| | | |
|---|---|---|
| 8,255,172 B2 | 8/2012 | Auerbach |
| 9,286,675 B1 | 3/2016 | Shabtay et al. |
| 9,613,255 B2 | 4/2017 | Amzaleg et al. |
| 11,055,840 B2 | 7/2021 | Liang |
| 2004/0032979 A1 | 2/2004 | Honda et al. |
| 2005/0004774 A1 | 1/2005 | Volk et al. |
| 2012/0081701 A1 | 4/2012 | Sasazawa et al. |
| 2012/0207381 A1 | 8/2012 | Ong et al. |
| 2015/0178914 A1 | 6/2015 | Marella et al. |
| 2015/0179400 A1 | 6/2015 | Lauber |
| 2016/0163038 A1* | 6/2016 | Shabtay ................ G06T 7/0012 382/149 |
| 2016/0258879 A1 | 9/2016 | Liang et al. |
| 2016/0284579 A1 | 9/2016 | Kaizerman et al. |
| 2016/0292492 A1* | 10/2016 | Amzaleg ................ G06V 40/33 |
| 2017/0082555 A1 | 3/2017 | He et al. |
| 2017/0200260 A1 | 7/2017 | Bhaskar et al. |
| 2018/0106732 A1 | 4/2018 | Plihal et al. |
| 2018/0149603 A1 | 5/2018 | Bhattacharyya et al. |
| 2018/0197714 A1 | 7/2018 | Plihal et al. |
| 2018/0306728 A1 | 10/2018 | Sofer et al. |
| 2019/0073566 A1 | 3/2019 | Brauer |
| 2019/0079022 A1 | 3/2019 | Shabtay et al. |
| 2019/0096057 A1 | 3/2019 | Allen et al. |
| 2019/0293569 A1* | 9/2019 | Hirszhorn ............. G06T 7/0004 |
| 2019/0293669 A1* | 9/2019 | Savchenko ............ G06N 20/00 |
| 2019/0333208 A1 | 10/2019 | Asbag et al. |
| 2020/0175665 A1* | 6/2020 | Park ................... G01N 21/9501 |
| 2020/0234428 A1 | 7/2020 | George et al. |
| 2021/0109041 A1 | 4/2021 | Gaind et al. |
| 2022/0309640 A1* | 9/2022 | Liu ....................... G06T 7/0004 |

FOREIGN PATENT DOCUMENTS

| | | |
|---|---|---|
| CN | 108020561 A | 5/2018 |
| CN | 109813717 A | 5/2019 |

\* cited by examiner

SELECTING A REPRESENTATIVE SUBSET OF POTENTIAL DEFECTS TO IMPROVE DEFECT CLASSIFIER TRAINING AND ESTIMATION OF EXPECTED DEFECTS OF INTEREST

RELATED APPLICATION

This application is a continuation of U.S. patent application Ser. No. 16/782,005, filed Feb. 4, 2020, the entire content of which is hereby incorporated by reference.

TECHNICAL FIELD

The presently disclosed subject matter relates, in general, to the field of examination of a specimen, and more specifically, to methods and systems for defect detection of a specimen.

BACKGROUND

Current demands for high density and performance, associated with ultra large scale integration of fabricated devices, require submicron features, increased transistor and circuit speeds, and improved reliability. Such demands require formation of device features with high precision and uniformity, which, in turn, necessitate careful monitoring of the fabrication process, including automated examination of the devices while they are still in the form of semiconductor wafers. It is noted that the fabrication process can include pre-manufacture, manufacture and/or post-manufacture operations.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "examination" used in this specification should be expansively construed to cover any kind of metrology-related operations as well as operations related to detection and/or classification of defects in a specimen during its fabrication. Examination is carried out by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof using the same or different examination tools. Likewise, at least some examination can be carried out prior to manufacture of the specimen to be examined, and can include, for example, generating an examination recipe(s), training respective classifiers or other machine learning-related tools and/or other setup operations. It is noted that, unless specifically stated otherwise, the term "examination" or its derivatives used in this specification, is not limited with respect to resolution or to the size of an inspection area. A variety of non-destructive examination tools includes, by way of non-limiting example, scanning electron microscopes, atomic force microscopes, optical inspection tools, etc.

By way of non-limiting example, run-time examination can employ a two-phase procedure, e.g. inspection of a specimen followed by review of sampled locations of potential defects. During the first phase, the surface of a specimen is inspected at high-speed and relatively low-resolution. In the first phase, a defect map is produced to show locations on the specimen suspected of having high probability of a defect. During the second phase, at least some of such suspected locations are more thoroughly analyzed with relatively high resolution. In some cases both phases can be implemented by the same inspection tool, and, in some other cases, these two phases are implemented by different inspection tools.

Examination processes are used at various steps during semiconductor fabrication to detect and classify defects on specimens. Examination generally involves generating some output (e.g., images, signals, etc.) for a wafer by directing light or electrons to the wafer, and detecting the light or electrons from the wafer. Once the output has been generated, defect detection is typically performed by applying a defect detection method and/or algorithm to the output. Most often, the goal of examination is to provide high sensitivity to defects of interest, while suppressing detection of nuisance and noise on the wafer.

GENERAL DESCRIPTION

In accordance with certain aspects of the presently disclosed subject matter, there is provided a system to examine a specimen, the system comprising: a processing and memory circuitry (PMC) comprising a processor operatively coupled to a memory, the PMC configured to: obtain a plurality of defects of interest (DOIs) and a plurality of false alarms (FAs), from a review subset selected from a group of potential defects received from an inspection tool, wherein each potential defect is associated with a plurality of attribute values defining a location of the potential defect in an attribute space; generate a representative subset of the group of potential defects, the representative subset comprising potential defects selected in accordance with a distribution of the group of potential defects within the attribute space, and indicate the potential defects in the representative subset as FA; and upon training a classifier using data informative of the attribute values of the DOIs, the potential defects of the representative subset, and respective indications thereof as DOIs or FAs, apply the classifier to at least some of the potential defects to obtain an estimation of a number of expected DOIs in the specimen.

In addition to the above features, the method according to this aspect of the presently disclosed subject matter can comprise one or more of features (i) to (x) listed below, in any desired combination or permutation which is technically possible:

(i) Within the examination system, the PMC can be configured to select the representative subset as a coreset of the group of potential defects.

(ii) Within the examination system, the PMC can be configured to select the coreset of the group of potential defects using a K means parallel algorithm.

(iii) Within the examination system, the representative subset can be generated so as to have no overlap with the DOIs.

(iv) Within the examination system, the PMC can be configured to obtain the plurality of DOIs and the plurality of FAs as follows: select the review subset of potential defects from the group of potential defects; for each given potential defect from the review subset of potential defects: obtain an indication whether a given potential defect is a defect of interest or a false alarm, the indication being based on a received review tool image of the given defect; and respectively assign the given potential defect to the plurality of DOIs or the plurality of FAs.

(v) Within the examination system, the PMC can be configured to select the review subset of potential defects, obtain the indication, and assign the given potential defect as follows: cluster the group of potential defects to obtain a plurality of clusters; sample an initial group of potential defects from each of the plurality of clusters, in accordance with scores of the potential defects obtained using one or more utility functions; receive review results of the potential defects in the initial group of potential defects, and associate a label with each defect indicating whether each defect therein is a defect of interest or a false alarm; determine whether a predetermined review budget is exhausted; and if not, update the scores of remaining potential defects based on the review results, and repeat sampling, receiving the review results and associating.

(vi) Within the examination system, the group of potential defects can be a cluster of potential defects, and the classifier is trained and applied for the potential defects in the cluster.

(vii) Within the examination system, the number of expected DOIs can be verified for validating the classifier.

(viii) Within the examination system, the PMC can be further configured to estimate False alarm rate (FAR) using the number of expected DOIs.

(ix) Within the examination system, the estimation of a number of expected defects of interest in the specimen can be used to determine a budget of potential defects to be reviewed by a review tool when examining an additional specimen of a same type as the specimen.

(x) Within the examination system, the PMC can be a part of the inspection tool, or part of a review tool, or part of a combined inspection and review tool that is operated at different modes, or separate from the inspection tool and from the review tool.

In accordance with other aspects of the presently disclosed subject matter, there is provided a method of examining a specimen, comprising: obtaining a plurality of defects of interest (DOIs) and a plurality of false alarms (FAs), from a review subset selected from a group of potential defects received from an inspection tool, wherein each potential defect is associated with a plurality of attribute values defining a location of the potential defect in an attribute space; generating a representative subset of the group of potential defects, the representative subset comprising potential defects selected in accordance with a distribution of the group of potential defects within the attribute space, and indicating the potential defects in the representative subset as FA; and upon training a classifier using data informative of the attribute values of the DOIs, the potential defects of the representative subset, and respective indications thereof as DOIs or FAs, applying the classifier to at least some of the potential defects to obtain an estimation of a number of expected DOIs in the specimen.

This aspect of the disclosed subject matter can comprise one or more of features (i) to (x) listed above with respect to the system, mutatis mutandis, in any desired combination or permutation which is technically possible.

In accordance with other aspects of the presently disclosed subject matter, there is provided a non-transitory computer readable medium comprising instructions that, when executed by a computer, cause the computer to perform a method of examination of a specimen, the method comprising: obtaining a plurality of defects of interest (DOIs) and a plurality of false alarms (FAs), from a review subset selected from a group of potential defects received from an inspection tool, wherein each potential defect is associated with a plurality of attribute values defining a location of the potential defect in an attribute space; generating a representative subset of the group of potential defects, the representative subset comprising potential defects selected in accordance with a distribution of the group of potential defects within the attribute space, and indicating the potential defects in the representative subset as FA; and upon training a classifier using data informative of the attribute values of the DOIs, the potential defects of the representative subset, and respective indications thereof as DOIs or FAs, applying the classifier to at least some of the potential defects to obtain an estimation of a number of expected DOIs in the specimen.

This aspect of the disclosed subject matter can comprise one or more of features (i) to (x) listed above with respect to the system, mutatis mutandis, in any desired combination or permutation which is technically possible.

BRIEF DESCRIPTION OF THE DRAWINGS

In order to understand the invention and to see how it can be carried out in practice, embodiments will be described, by way of non-limiting examples, with reference to the accompanying drawings, in which.

DETAILED DESCRIPTION

Figure 1:
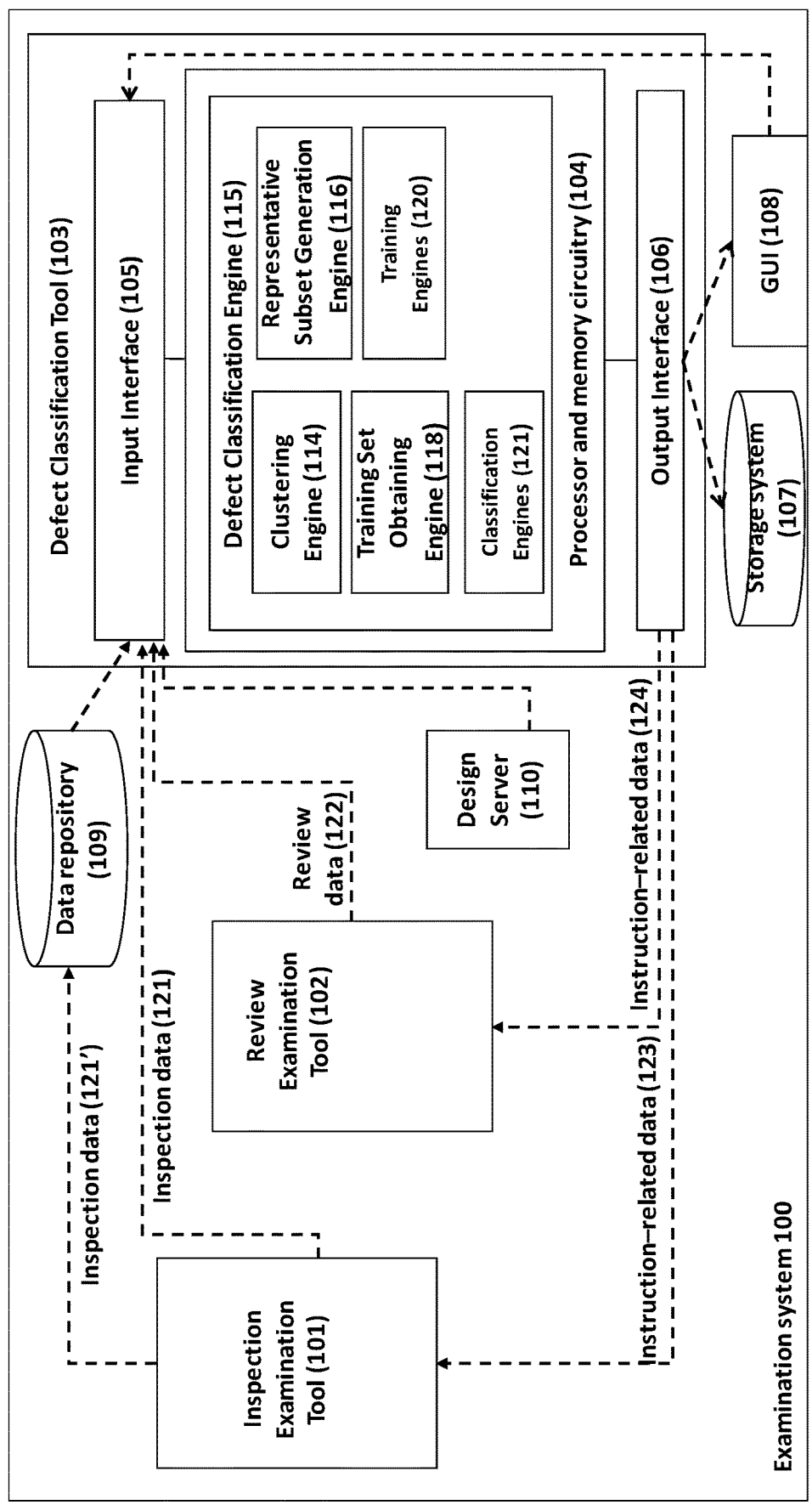
FIG. 1 illustrates a block diagram of an examination system, in accordance with certain embodiments of the presently disclosed subject matter.

In the following detailed description, numerous specific details are set forth in order to provide a thorough understanding of the invention. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "obtaining", "generating", "receiving", "training", "applying", "determining", "selecting", "assigning", "clustering", "sampling", "associating", "updating", "repeating", "validating", "estimating", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the examination system and respective parts thereof disclosed in the present application.

The terms "non-transitory memory" and "non-transitory storage medium" used herein should be expansively construed to cover any volatile or non-volatile computer memory suitable to the presently disclosed subject matter.

The term "defect" used in this specification should be expansively construed to cover any kind of abnormality or undesirable feature formed on or within a specimen.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats as, by way of non-limiting examples, GDSII format, OASIS format, etc. Design data can be presented in vector format, grayscale intensity image format, or otherwise.

The term "sampling" used herein should be expansively construed to cover any selecting of one or more specimen locations from a collection of specimen locations obtained from an inspection tool or from any other source, for example received from a user, extracted from design data, reported by previous processes, received from external sources, or others. The sampled specimen locations may be selected from amongst the collection of specimen locations, to be reviewed by a review tool. As detailed below, each location can be described as a collection of attribute values, thus the collection of locations spans an attribute space. Sampling may be broadly construed as selecting a set of locations that represent the spanned attribute space.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a generalized block diagram of an examination system in accordance with certain embodiments of the presently disclosed subject matter. Examination system 100 illustrated in FIG. 1 can be used for examination of a specimen (e.g. of a wafer and/or parts thereof) as a part of specimen fabrication. Examination can be part of the specimen fabrication, and can be carried out during manufacturing the specimen, or afterwards. The examination system can comprise a variety of examination tools, for example, one or more inspection tools 101 configured to capture inspection images (captured typically at relatively high-speed and/or low-resolution, e.g., by an optical inspection system, low-resolution SEM, etc.) and output potential defects, e.g., locations at which a defect may be found, and one or more review tools 102 configured to capture review images of at least some of the potential defects detected by inspection tools 101 typically, at relatively low-speed and/or high-resolution, e.g. by a scanning electron microscope (SEM) or Atomic Force Microscopy (AFM).

As mentioned above, images of a desired location on a specimen can be captured at different resolutions. In some embodiments, images of the same location (with the same or different resolutions) can comprise several images registered therebetween.

A specimen can be examined by inspection tool 101. The resulting images and/or derivatives can be processed (optionally together with other data as, for example, design data and/or defect classification data) to select potential defects for review, to assess the number of defects, and/or to characterize the defects in the specimen.

Illustrated examination system 100 comprises a computer-based automated defect classification tool 103. Defect classification tool 103 can be operatively connected to one or more inspection tools 101 and/or one or more review tools 102. Optionally, defect classification tool 103 can be a standalone tool, or fully or partly integrated with or hosted by one or more inspection tools 101 or review tools 102. Defect classification tool 103 can be further operatively connected to design server 110 and/or data repository 109.

By way of non-limiting example, defect classification tool 103 can be usable for different purposes. For example, for automatically classifying potential defects provided by inspection examination tool 101 into a plurality of classes, and in particular into defects of interest (DOIs) and false alarms (FAs); filtering FAs from DOIs, identifying specific DOIs, assessing the number of DOIs in a specimen or their characteristics, selecting some of the potential defects provided by inspection tool 101 for review by review tool 102, establishing Pareto in order to identify excursions in statistical process control (SPC), and/or others.

Defects can be represented as a collection of attributes, wherein each defect is associated with a value for one or more of the attributes. Some attributes can be numeric and may be assigned any value from a finite or infinite range; other attributes may be assigned discrete numeric or non-numeric values. Thus, each defect represents a point in the attribute space spawned by the possible attribute values. A metric may be defined for determining the distance between two defects in the attribute space, based on their attribute values.

Defect classification tool 103 may be configured to receive, via input interface 105, input data. The input data can include image data (and/or derivatives thereof and/or metadata associated therewith) produced by the inspection tool 101 and/or review tool 102 and/or data stored in design data server 110 and/or one or more data repositories. In some embodiments, the input data can include one or more runtime images.

Defect classification tool 103 comprises a processor and memory circuitry (PMC) 104 operatively connected to a hardware-based input interface 105 and to a hardware-based output interface 106. PMC 104 can be a part of inspection tool 101, a part of review tool 102, or a part of a combined tool combining inspection tool 101 and review tool 102 operated at different modes.

PMC 104 is configured to provide processing necessary for operating the defect classification tool 103 as further detailed below, and comprises a processor and a memory (not shown separately within PMC). The operation of defect classification tool 103 and PMC 104 is further detailed with reference to FIGS. 2-4 below.

PMC 104 can be configured to execute several functional modules in accordance with computer-readable instructions implemented on a non-transitory computer-readable storage medium. Such functional modules are referred to hereinafter as comprised in PMC 104. PMC 104 can comprise defect classification unit 115, configured to assess the number and characteristics of DOIs within the specimen, select some of the defects provided by inspection system tool 101 to be reviewed by review tool 102, identify excursions in statistical process control (SPC), or the like.

Defect classification unit 115 can comprise clustering engine 114 configured to receive a collection of points in an attribute space and cluster them into two or more clusters, such that the distance between a first point and another point in the same cluster is smaller than the distance between the first point and a third point assigned to another cluster. Thus, clustering engine 114 may be used for clustering a plurality of potential defects, in accordance with one or more metrics defined for the attribute space.

Defect classification unit 115 can comprise representative subset generation engine 116 configured to select defects from a given group of defects. Representative subset generation engine 116 can select defects in accordance with the distribution of the given group of defects in the attribute space.

Defect classification unit 115 can comprise training set obtaining engine 118, for gathering a training set for training a classifier. The training set can comprise potential defects provided by inspection examination tool 101 that have been reviewed by review tool 102 and labeled as a DOI or a FA in accordance with the review results. Additionally, the training set can comprise a subset of the potential defects provided by inspection examination tool 101, as selected, for example, by representative subset generation engine 116, and labeled as FAs, as detailed below.

Defect classification unit 115 can comprise training engine 120 configured to train one or more engines such as classification engine 121 upon a training set including the corresponding labels, as obtained by training set obtaining engine 118. Training engine 120 is thus capable of receiving a training set comprising defects and labels thereof, and determining separation planes and probability distribution planes to be used by a classifier. The separation planes form sub-spaces within the attribute space, such that all defects in the same sub-space are associated with the same class, for example one or more FA classes or one or more DOI classes. The better the training set represents the potential defect population, the better is the classification, since the planes as determined upon the training set are applicable to the potential defect population. It will be appreciated that the disclosure is equally applicable for any type of classifier, for example classical classifiers, deep neural networks, or others.

Defect classification unit 115 can comprise classification engine 121, as trained by training engine 120 and can be used for classifying the potential defects provided by inspection examination tool 101. In some embodiments, classification engine 121 may be used for classifying only defects that have not been reviewed by review tool 102. Classification engine 121 is capable of automatically classifying defects, for example in accordance with the separation planes as determined during training. Classification engine 121 can be configured to define, for each given defect, a confidence level indicative of probability that the defect belongs to a certain class, and to assign the given defect to the certain class if the confidence level meets a respective confidence threshold.

Classification engine 121 may also use the classification results for any purpose, for example assessing the number of DOIs in the potential defects provided by inspection examination tool 101 without reviewing all of them since this is impractical, obtaining classification thereof, selecting defects to be reviewed by review tool 102, or the like.

Illustrated examination system 100 can comprise data repository 109, which can store, for example, data related to the specimen, to inspection results of the specimen, or the like.

Illustrated examination system 100 can comprise storage system 107 for storing data related to the examination of the specimen, such as detected DOIs, detected FAs, additional potential defects, thresholds, or the like.

Illustrated examination system 100 can comprise design server 110, comprising design data of the specimen, such as Computer Aided Design (CAD) data.

Illustrated examination system 100 can comprise GUI 108 for receiving input from a user, such as the number of potential defects to be reviewed, and providing output to the user, such as the estimated number in DOIs in the specimen, their characteristics, or the like. GUI 108 can be further configured to enable user-specified inputs related to operating system 100. Operation of system 100, PMC 104 and the functional modules therein will be further detailed with reference to FIGS. 2-4 below.

Those skilled in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and hardware.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in other embodiments at least some of the examination tools 101 and/or 102, data repository 109, storage system 107 and/or GUI 108 can be external to examination system 100 and operate in data communication with defect classification tool 103. Defect classification tool 103 can be implemented as a stand-alone computer(s) to be used in conjunction with one or more examination tools. Optionally, defect classification tool 103 can operate on pre-acquired inspection data 121' stored in data repository 109 and/or storage system 107. Alternatively or additionally, the respective functions of defect classification tool 103 can, at least partly, be integrated with one or more examination tools, process control tools, recipe generation tools, systems for automatic defects review and/or classification, and/or other systems related to examination.

Figure 2:
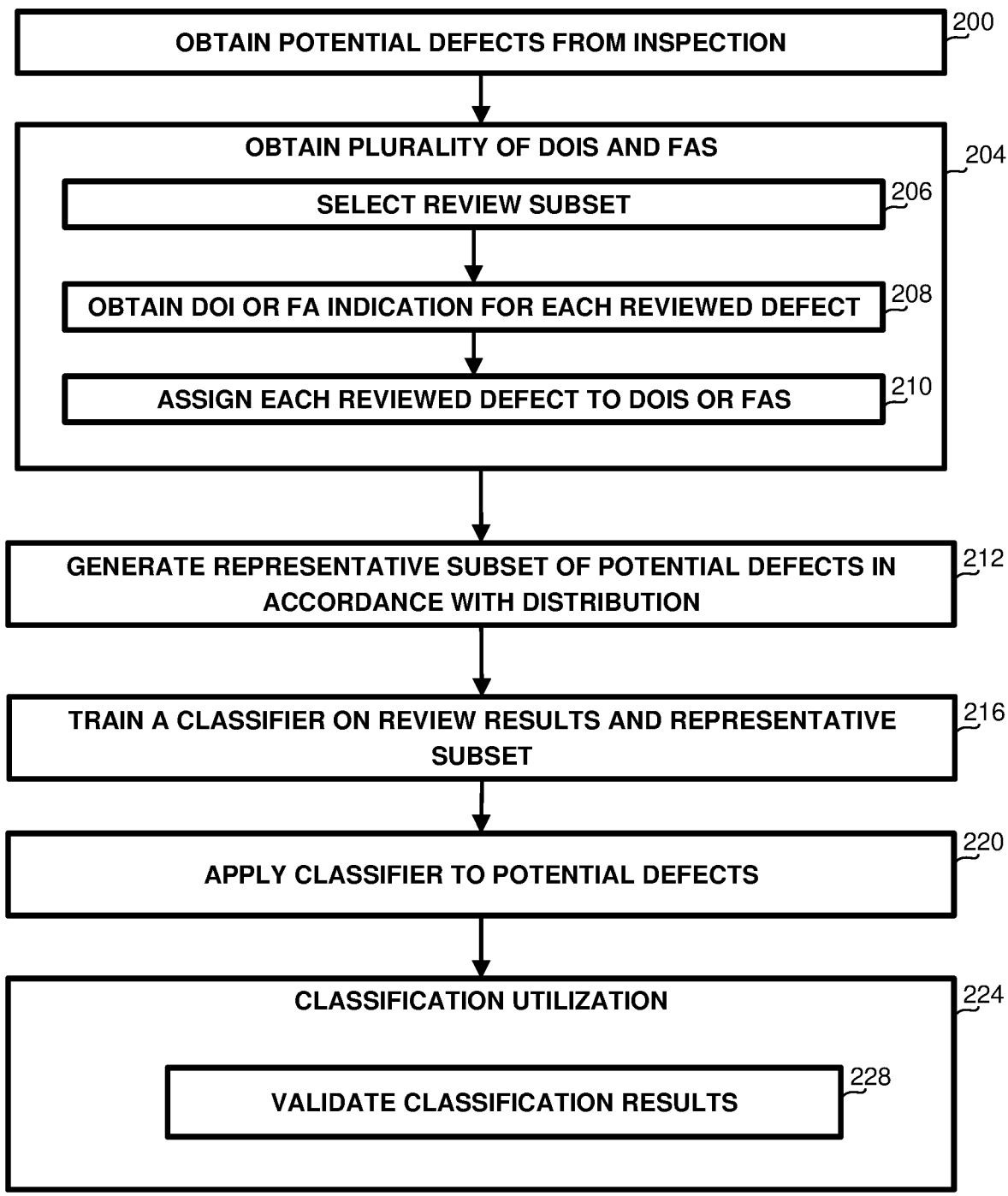
FIG. 2 illustrates an exemplary flowchart of examining a specimen, in accordance with certain embodiments of the presently disclosed subject matter.

Reference is now made to FIG. 2, showing a flowchart of a method of examining a specimen, in accordance with certain embodiments of the presently disclosed subject matter.

PMC 104 can obtain (200) a plurality of potential defects, for example from inspection examination tool 101, from data repository 109, or from any other source. In a typical wafer the order of magnitude of the number of potential defects may be between tens of thousands and millions, thus although it is highly important to detect DOIs, it is impractical to review each and every potential defect in order to determine whether it is a DOI, a FA, or a nuisance. Therefore, a small fraction of the potential defects, for example between a few dozens and a few thousand defects, may be reviewed, and conclusions may be drawn from the review results.

PMC 104 can thus obtain (204) a plurality of DOIs and FAs. The DOIs and FAs can be used as part of a training set for training a classifier for obtaining further information on the specimen.

Specifically, for obtaining DOIs and FAs, PMC 104 can select (206) a subset of the potential defects to be reviewed, for example by review tool 102, obtain (208) DOI or FA indication for each reviewed potential defect, and assign (210) each reviewed defect to the DOIs or to the FAs, depending on the received indication.

Selection step (206), obtaining indications step (208) and assigning step (210) are further detailed in association with FIG. 3A below in accordance with certain embodiments of the presently disclosed subject matter.

Representative subset generation engine 116 can generate (212) a representative subset of the potential defects, in accordance with the distribution of the potential defects within the attribute space. Thus, an objective of the selection can be to obtain a subset that represents the dense areas of potential defects, but also potential defects from sparser areas, although in smaller numbers. The representative subset may be selected not to include any of the reviewed potential defects.

The subset may be selected in a variety of ways. One such way is random sampling. However, in order to closely represent the potential defect population, a significant number of the potential defects need to be selected, for example 20%.

By making a smart selection, that takes into account the distribution of the population, a much smaller number of potential defects may be sufficient. Such a smartly selected subset is referred to herein as a coreset, and one exemplified method for selecting the coreset is the K means parallel algorithm. In general, the K means parallel algorithm operates as follows: randomly selecting a first defect, then selecting a second defect that is farthest from the first, selecting a third defect that is farthest form the first and the second defects, and so on. The representative set may be selected such that it contains no overlap with the reviewed defects.

Due to the characteristics and nature of optical scanning, a significant majority of the potential defects as provided by inspection examination tool 101, for example over 95%, are FAs. Therefore, the defects of the representative subset are also considered as such, and therefore marked as FAs, although they have not been reviewed. It will be appreciated that even if some of the defects of the representative set are actually DOIs rather than FAs, such mistakes will not have any significant effect on the training that follows.

Training set obtaining engine 118 can collect the representative subset (such as the coreset) generated on step 212 which is defined to consist of FAs, the DOIs obtained at step 204 and optionally the FAs obtained at step 204, thereby obtaining a training set.

Training engine 120 can then train (216) a classification engine 121, also referred to as classifier, using the training set comprised at least of the review results, i.e., the DOIs as determined by review tool 102, and the representative subset selected on step f comprising potential defects all defined as FAs. In some embodiments, the FAs as determined by review tool 102 may also be used for training.

Upon training classification engine 121, the trained classification engine 121 can then be applied (220) to the potential defects, to obtain DOI and FA estimations. In some embodiments, classification engine 121 can be applied only to potential defects that have not been reviewed. However, classification engine 121 can be applied to the whole population of potential defects including also potential defects that have been reviewed and it is thus known whether they are a DOI or a FA, in order to evaluate the accuracy of classification engine 121. In some embodiments, estimations can be provided for the potential defects within each area separated by the separation planes.

The results of applying classification engine 121 can be utilized (224) in a variety of ways, for example groups of potential defects associated with one or more DOI classes of FA classes may be determined. The classification results can also enable a user to conduct meaningful statistical process control (SCP), obtain a probability for each potential defect to be a DOI, estimate of the number of DOIs vs. the number of FAs in the potential defects, or the like. The results of the classifier may also be used for determining the number of reviews to be performed, i.e., the review budget, when examining further specimens of the type of the specimen being examined. By way of another example, the false alarm rate (FAR) may be estimated. The FAR calculation is detailed in association with FIG. 4A and FIG. 4B below.

In some embodiments, validation (228) of the classification results can be performed, e.g., by a customer, such as the manufacturer of the specimen. By way of example, the DOIs as classified by the classifier, or part thereof, can be reviewed by the customer for verifying whether or not they are classified correctly, thereby evaluating the accuracy of the classifier trained on step 216 above.

Figure 3A:
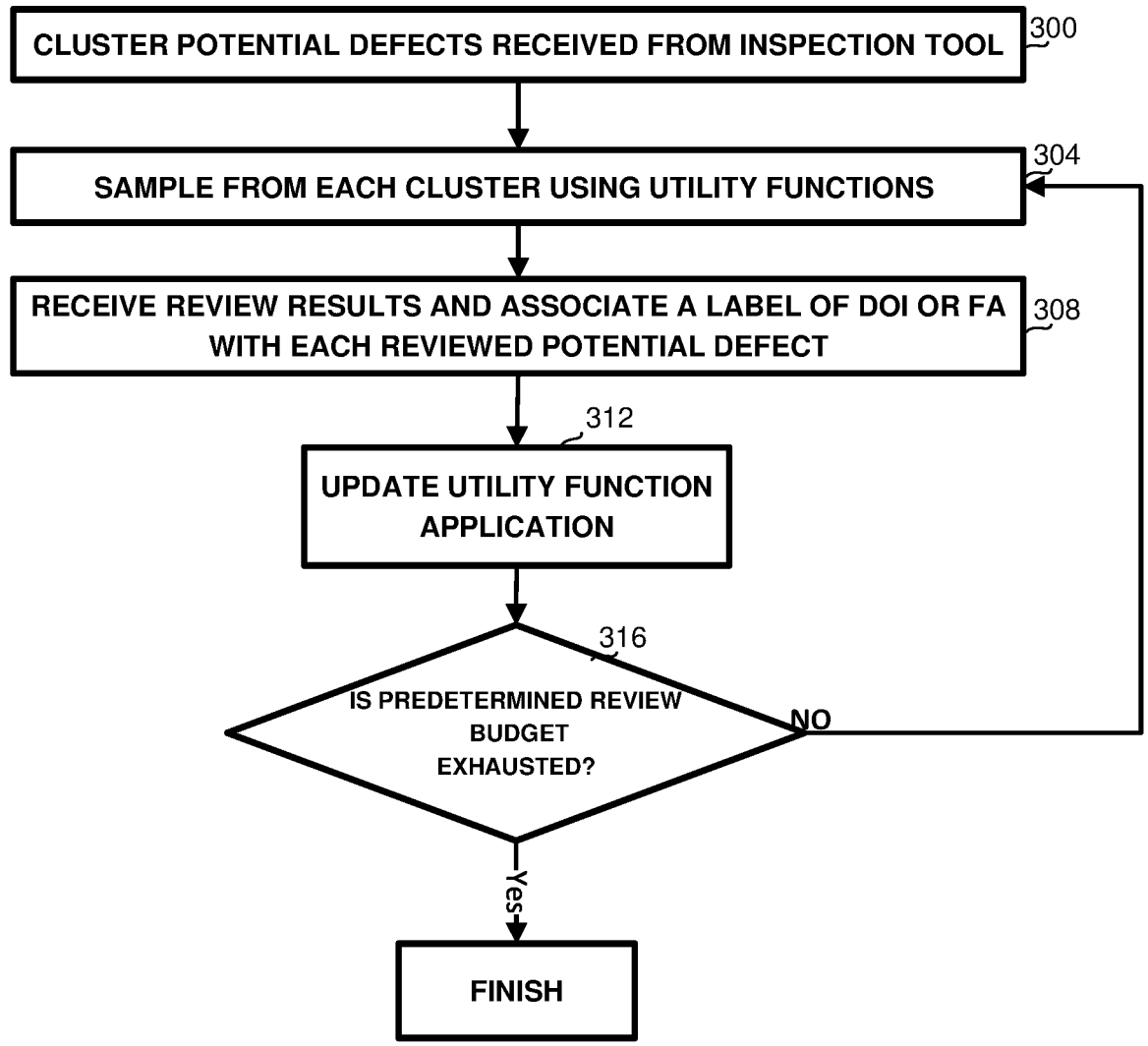
FIG. 3A illustrates an exemplary flowchart of selecting, reviewing and assigning labels to potential defects, in accordance with certain embodiments of the presently disclosed subject matter.
Figure 3B:
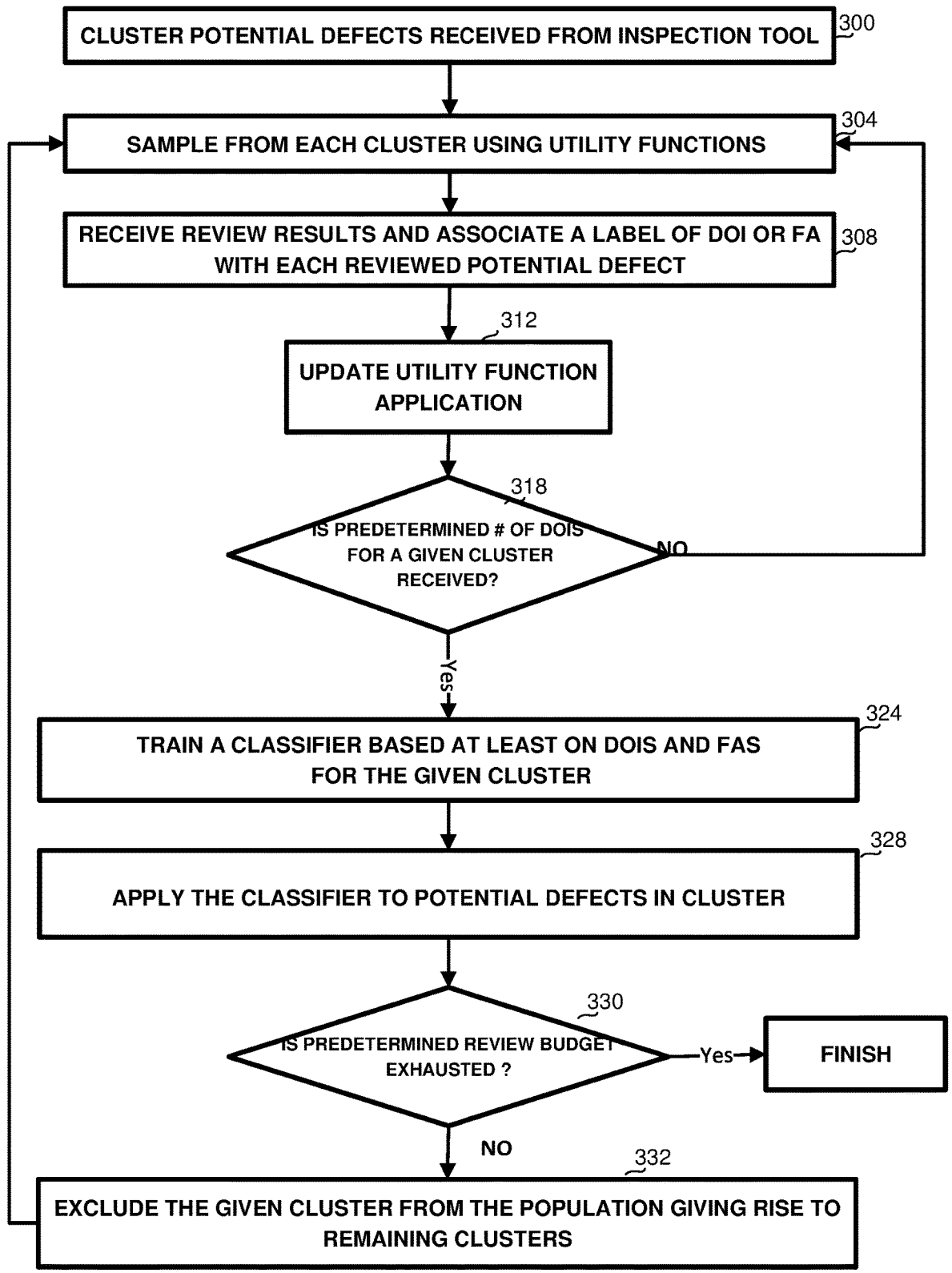
FIG. 3B illustrates an exemplary flowchart of defect classification per cluster, in accordance with certain embodiments of the presently disclosed subject matter.

According to certain embodiments, the above described defect classification process with reference to FIG. 2 can be implemented cluster-wise, as will be detailed further with reference to FIG. 3B.

Reference is now made to FIG. 3A, showing a detailed flow chart of selection step (206), obtaining indications step (208) and assigning step (210), in accordance with certain embodiments of the presently disclosed subject matter.

Clustering engine 114 can cluster (300) the potential defects as received from inspection tool 101. The potential defects can be clustered into two or more clusters in the attribute space, wherein the distance between first and second potential defects assigned to the same cluster is lower than the distance between the first or second potential defects and other potential defects assigned to other clusters. The distance between two potential defects is determined based on a metric, which can depend on the attributes and their types. Clustering can be automatic, manual, or a combination thereof, wherein automatic clustering may be subject to human intervention. For example, a user may provide initial clusters, discover that a cluster should be split into two or more clusters, since it contains potential defects that are inherently different. A user may also discover two separate clusters that should be unified. A user may change the attributes extracted from the inspection of the specimen, and/or the metric applied for calculating the distance between potential defects, however such changes will generally be used for future specimen examinations.

Initial subset generation engine 116 may sample (304) a subset of potential defects from each cluster.

Sampling step (304) may be performed in an iterative approach. For example, a first batch of samples can be selected from all the clusters using one or more utility functions, each utility function assigning a score to each potential defect, and the scores may be combined, for example using a weighted combination.

In some embodiments, the utility functions may include at least one unsupervised utility function and at least one supervised utility function. All utility functions may perform calculations involving the attribute values of the potential defect. As detailed below, sampling step (304) may be performed iteratively. On the first iteration, when no data is available, only unsupervised utility functions may be used, while subsequent iterations may also involve supervised utility functions, which provide further information on the cluster.

The sampled defects may then be imaged, for example using review tool 102. PMC 104 may receive (308) the review results and associate a label of DOI or FA with each reviewed potential defect.

The selected potential defects may be reviewed and PMC 104 may receive (308) the review results and associate with each reviewed potential defect a label of DOI or FA.

PMC 104 can then update (312) the application of the utility functions based on the review results. By way of example, the reviewed results can be used to recalculate the score for each remaining potential defect (based on the supervised and unsupervised functions) and an updated score for each potential defect can be obtained. In one example, the re-calculation of the score may relate to a distance between the remaining potential defects and the reviewed DOIs. In some cases, on the second iteration, a weight may be given to the supervised utility functions, and on further iterations the weights of the supervised utility functions may be increased.

PMC 104 can then determine (316) whether the predetermined review budget, e.g. the number of reviews allotted for the whole population of potential defects, has been reached. If not, execution may return to sampling step (304) for sampling additional batches of potential defects, based on the updated scores. If the review budget is exhausted, the flow as described in FIG. 3A has completed and the process returns to FIG. 2 and continues with step 212, as described above.

It will be appreciated that although the steps are presented sequentially for each cluster before moving on to the next cluster, this is not necessary, and execution can be started for a second cluster when a first cluster is still in progress. However, such an arrangement necessitates monitoring of the total number of executed reviews, rather than the number performed for each cluster.

It will also be appreciated that the sample, review and label assignment method may be directly applied to the whole potential defects population rather than to respective clusters. In such an embodiment, clustering step (300) and further cluster determination step (320) may be omitted, and the iterative sampling process as described in steps 304, 308, 312 and 316 can be applied to the whole potential defect population.

Reference is now made to FIG. 3B, showing a detailed flowchart of defect classification per cluster, in accordance with certain embodiments of the presently disclosed subject matter.

Steps 300, 304, 308, and 312 are described above with reference to FIG. 3A, and are thus not repeated here. Once the review results are received (step 308) and the utility function application is updated (step 312), PMC 104 can determine (318) whether a predetermined number of DOIs are received for any given cluster. If there is a given cluster for which a predetermined number of DOIs are received, training engine 120 can receive, for the given cluster, the reviewed potential defects together with the DOI and FA labels, and train (324) a corresponding classifier for the given cluster.

In some embodiments, further potential defects may be selected for the training set from the given cluster, for example a coreset. The further potential defects selected may be assumed to be false alarms, as detailed in the step of generating the representative subset (212) above. In such cases, the classifier can be trained (324) using the received DOIs and FAs, as well as the coreset indicated as FAs.

The trained classifier may be applied (328) to the non-reviewed potential defects of the given cluster (or alternatively to the whole population in the cluster). Following the classification, the results per cluster can be utilized in a similar manner as described above with reference to step 224.

PMC 104 may determine (328) whether a predetermined review budget for the whole population of potential defects is exhausted, and if so, the process has been completed. If not, the given cluster (for which the classifier is trained) can be excluded (332) from the population, giving rise to the remaining clusters, which will be further sampled in accordance with step 304.

It will be appreciated that the method of FIG. 3B may be repeated for some or all of the clusters until the review budget is exhausted.

It will also be appreciated that the training classifier and applying the classifier to potential defects in the cluster as described with reference to steps 324 and 328 can be performed for a given cluster immediately once the condition in 318 is fulfilled, or, alternatively, these steps can be performed for all clusters once the review budget is exhausted and the method of FIG. 3B is completed.

Figure 4A:
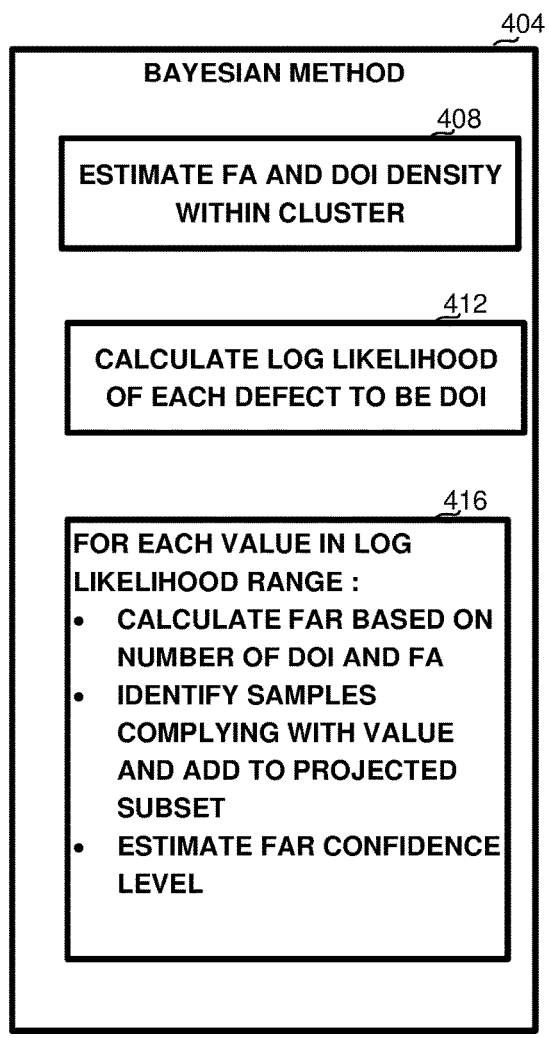
FIG. 4A and FIG. 4B show exemplary methods for estimating a false alarm rate of the potential defects within a cluster, in accordance with certain embodiments of the presently disclosed subject matter.
Figure 4B:
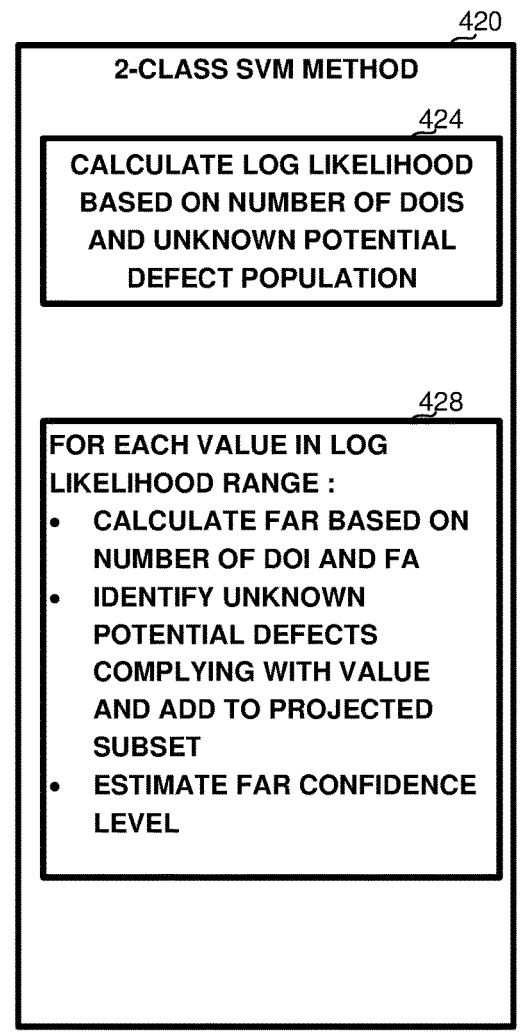

Reference is now made to FIG. 4A and FIG. 4B, showing exemplary methods for estimating the FAR of the potential defects within a cluster as one possible way of utilizing the results of applying classifier to the potential defects (step 224), in accordance with certain embodiments of the presently disclosed subject matter.

Reference is now made to FIG. 4A, wherein step 404 displays one estimation method, being the Bayesian method which may include:

On step 408, the density of DOIs and FAs within the cluster may be calculated. In some embodiments, the density may be calculated using the Kernel Density Estimation (KDE).

On step 412, the log likelihood of each potential defect to be a DOI (or a FA) may be calculated; and On step 416, the following actions may be performed for each value in the log-likelihood range (e.g. a working point):
Calculating the False Alarm Rate (FAR) based on the number of DOIs and FAs available for the cluster;
Identifying the samples that comply with this value and adding them to the projected subset; and
Estimating the FAR confidence level.

Reference is now made to FIG. 4B, wherein step 420 displays a second estimation method, being the 2-Class Support Vector Machine (SVM) method, which may include:

On step 424, the log-likelihood may be calculated based on the number of DOIs and unknown potential defect populations.

On step 428 the following actions may be performed for each value in the log-likelihood range (e.g. a working point):
Calculating the FAR based on the number of DOIs and FAs;
Identifying the unknown potential defects that comply with the value and adding them to the selected subset; and
Estimating the FAR confidence level.

The estimated FAR provides an indication of the probability of defects in the particular cluster to be false alarms.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Those skilled in the art will readily appreciate that various modifications and changes can be applied to the embodiments of the invention as hereinbefore described.

What is claimed is:

1. A computerized system of examining a semiconductor specimen, the system comprising a processing and memory circuitry (PMC) configured to:
   obtain a plurality of defects of interest (DOIs) and a plurality of false alarms (FAs) from a review subset reviewed by a review tool, the review subset selected from a group of potential defects received from an inspection tool, wherein each potential defect is associated with a plurality of attribute values defining a location of the potential defect in an attribute space;
   generate a representative subset of the group of potential defects, the representative subset comprising potential defects selected in accordance with a distribution of the group of potential defects within the attribute space, and indicate the potential defects in the representative subset as FAs; and
   training a classifier using data informative of the attribute values of the plurality of DOIs, the potential defects of the representative subset, and respective indications thereof as DOIs or FAs, wherein the trained classifier is to be applied to at least some of the group of potential defects to obtain an estimation of a number of expected DOIs in the semiconductor specimen.

2. The computerized system according to claim 1, wherein the representative subset comprises a relatively smaller number of potential defects selected from the group of potential defects so as to represent both dense areas and sparse areas of the distribution of the group of potential defects in the attribute space.

3. The computerized system according to claim 2, wherein the representative subset is selected such that it does not overlap with potential defects from the review set.

4. The computerized system according to claim 2, wherein the representative subset is selected as a coreset of the group of potential defects.

5. The computerized system according to claim 4, wherein the coreset is selected as a relatively smaller set of potential defects that approximates shape of the distribution of the group of potential defects in the attribute space.

6. The computerized system according to claim 4, wherein the coreset is selected using a K means parallel algorithm.

7. The computerized system according to claim 4, wherein the coreset is selected using a K means parallel algorithm by:
   randomly selecting a first potential defect;
   selecting a second potential defect that is farthest from the selected first potential defect;
   selecting a next potential defect that is farthest form the selected first and second potential defects; and
   repeating the selecting a next potential defect that is farthest form the selected potential defects until the coreset of potential defects is obtained.

8. The computerized system according to claim 1, wherein the data used to train the classifier further comprises data informative of the attribute values of the plurality of FAs, and indications thereof as FAs.

9. The computerized system according to claim 1, wherein the PMC is configured to obtain the plurality of DOIs and the plurality of FAs by:
   selecting the review subset of potential defects from the group of potential defects; and
   for each given potential defect from the review subset of potential defects:
      obtaining an indication whether a given potential defect is a DOI or a FA, the indication being based on an image of the given potential defect acquired by the review tool; and
      respectively assigning the given potential defect to the plurality of DOIs or the plurality of FAs.

10. The computerized system according to claim 1, wherein the PMC is configured to obtain the plurality of DOIs and the plurality of FAs by:
    clustering the group of potential defects to obtain a plurality of clusters;
    sampling an initial group of potential defects from each of the plurality of clusters, in accordance with scores of the potential defects obtained using one or more utility functions;
    receiving review results of the potential defects in the initial group of potential defects, and associating a label with each potential defect indicating whether the potential is a DOI or a FA;
    determining whether a predetermined review budget of the review subset is exhausted; and
    in response to the predetermined review budget not being exhausted, updating the scores of remaining potential defects based on the review results, and repeating said sampling, said receiving the review results and said associating until the predetermined review budget is exhausted, giving rise to the plurality of DOIs and the plurality of FAs.

11. The computerized system according to claim 1, wherein the group of potential defects are a cluster of potential defects from a plurality of clusters of potential defects in the attribute space, and the classifier is trained and applied for the potential defects in the cluster.

12. The computerized system according to claim 1, wherein the at least some of the group of potential defects are one of: potential defects in the group that have not been reviewed by the review tool, potential defects within each area separated by separation planes as determined during the training, or whole population of the group of potential defects.

13. The computerized system according to claim 1, wherein the PMC is further configured to estimate False alarm rate (FAR) using the number of expected DOIs.

14. The computerized system according to claim 1, wherein the estimation of a number of expected DOIs is usable to determine a budget of potential defects to be reviewed by the review tool when examining an additional specimen of a same type as the specimen.

15. A computerized method of examining a semiconductor specimen, the method performed by a processing and memory circuitry (PMC) and comprising:
- obtaining a plurality of defects of interest (DOIs) and a plurality of false alarms (FAs) from a review subset reviewed by a review tool, the review subset selected from a group of potential defects received from an inspection tool, wherein each potential defect is associated with a plurality of attribute values defining a location of the potential defect in an attribute space;
- generating a representative subset of the group of potential defects, the representative subset comprising potential defects selected in accordance with a distribution of the group of potential defects within the attribute space, and indicating the potential defects in the representative subset as FAs; and
- training a classifier using data informative of the attribute values of the plurality of DOIs, the potential defects of the representative subset, and respective indications thereof as DOIs or FAs, wherein the trained classifier is to be applied to at least some of the group of potential defects to obtain an estimation of a number of expected DOIs in the semiconductor specimen.

16. The computerized method according to claim 15, wherein the representative subset comprises a smaller number of potential defects selected from the group of potential defects so as to sufficiently represent both dense areas and sparse areas of the distribution of the group of potential defects in the attribute space.

17. The computerized method according to claim 16, wherein the representative subset is selected such that it does not overlap with potential defects from the review set.

18. The computerized method according to claim 16, wherein the representative subset is selected as a coreset of the group of potential defects.

19. The computerized method according to claim 18, wherein the coreset is selected as a relatively smaller set of potential defects that approximates shape of the distribution of the group of potential defects in the attribute space.

20. A non-transitory computer readable storage medium tangibly embodying a program of instructions that, when executed by a computer, cause the computer to perform operations for examining a semiconductor specimen, the operations comprising:
- obtaining a plurality of defects of interest (DOIs) and a plurality of false alarms (FAs) from a review subset reviewed by a review tool, the review subset selected from a group of potential defects received from an inspection tool, wherein each potential defect is associated with a plurality of attribute values defining a location of the potential defect in an attribute space;
- generating a representative subset of the group of potential defects, the representative subset comprising potential defects selected in accordance with a distribution of the group of potential defects within the attribute space, and indicating the potential defects in the representative subset as FAs; and
- training a classifier using data informative of the attribute values of the plurality of DOIs, the potential defects of the representative subset, and respective indications thereof as DOIs or FAs, wherein the trained classifier is to be applied to at least some of the group of potential defects to obtain an estimation of a number of expected DOIs in the semiconductor specimen.

* * * * *